United States Patent [19]
Chandler et al.

[11] Patent Number: 5,666,264
[45] Date of Patent: Sep. 9, 1997

[54] INDUSTRIAL COMPUTER WORKSTATION

[75] Inventors: Gregory J. Chandler, Saline; Kevin M. Stonebraker, Belleville; Anthony B. Vink, Plymouth, all of Mich.

[73] Assignee: Nematron Corporation, Ann Arbor, Mich.

[21] Appl. No.: 645,234

[22] Filed: May 13, 1996

[51] Int. Cl.[6] .................. G06F 1/16; H05K 7/10
[52] U.S. Cl. .............. 361/683; 361/679; 361/724; 439/341
[58] Field of Search .................. 361/679, 683, 361/681, 682, 724, 725, 727, 728; 364/708.1; 439/341, 376, 247, 248, 326; 312/223.1–223.3; G06F 1/16

[56] References Cited

U.S. PATENT DOCUMENTS

| | | | |
|---|---|---|---|
| 4,869,681 | 9/1989 | Vache et al. | 439/341 |
| 5,097,386 | 3/1992 | Byell et al. | 361/695 |
| 5,132,872 | 7/1992 | Hase | 361/692 |
| 5,486,982 | 1/1996 | Hsu | 361/728 |
| 5,598,318 | 1/1997 | Dewitt et al. | 361/683 |

*Primary Examiner*—Leo P. Picard
*Assistant Examiner*—Lynn D. Feild
*Attorney, Agent, or Firm*—Howard & Howard

[57] ABSTRACT

Front and rear housings of a industrial computer workstation are mechanically connected by separable hinges and a manually operable latch and are electrically connected in a closed position through a cableless connection provided by a two-part electrical connector. The connector includes connector halves which mate together in the closed position. The front and rear housings are pivotally and completely removably connected to move from the closed position to an open position by the separable hinges. The front housing is adapted to be permanently mounted to an end user's electrical panel. The rear housing is piloted and latched into place against the front housing by a pilot and the latch, respectively. The latch and the separable hinges eliminate the need for any special tools in completely removing the rear housing. The pilot is preferably a tapered pin which steers and seats the rear housing against the front housing. Once the rear housing is unlatched and hinged out, it can be lifted off the separable hinges. The front housing preferably supports a membrane keyboard for user interface with a computer housed within the rear housing. The front housing also includes a window in which a flat panel display preferably housed within the rear housing is aligned for the projection of images through the window. In this way, access to change electronic components such as the computer, the display, and display back lights is easy, thereby providing easy maintenance and service of the electronic components.

12 Claims, 7 Drawing Sheets

5,666,264

INDUSTRIAL COMPUTER WORKSTATION

TECHNICAL FIELD

This invention relates to industrial computer workstations and, in particular, industrial computer workstations which are relatively easy to maintain and service.

BACKGROUND ART

Industrial computer workstations typically are industrial personal computers that include a flat panel display, a microprocessor, memory disk storage, keypad, touch screen and/or pointing device. Such workstations are typically designed to run under DOS, Windows 95 or NT, and other popular operating systems and can utilize a number of application programs which are commercially available. Also, such workstations can typically be expanded using expansion cards (available in many form factors).

As illustrated in FIG. 1, such keypad input may be provided by a sealed membrane keypad with multiple relegendable function keys and dedicated cursor and operation keys. Typically, any individual key is programmable.

A typical pointing device, as also illustrated in FIG. 1, is a Microsoft mouse compatible industrial pointing device.

The flat panel display may be either a monochrome, passive or active color display. Also, the memory may include DRAM and flash memory and the workstation may also include a hard drive, a floppy drive, CDROM drive, PCMCIA expansion, and others.

Typically, the main circuit board in the workstation of FIGS. 1–4 handles the computing tasks and also provides the following functions for external connections to an external keyboard, communication ports, parallel/printer port, and external floppy port. Also, the mainboard provides internal connections for a front panel display/keyboard connector, fan power, hard drive interface and connector, power connector, DRAM SIMM sockets, cache memory sockets, ISA, EISA and/or PCI header and card mounting standoffs, and internal floppy.

External connector ports are specifically illustrated in FIG. 3.

As illustrated in FIGS. 3 and 4, the workstation can be installed as a unit in a customer's electrical panel by first positioning the workstation within a cut-out in the panel and then, from the rear of the workstation, inserting mounting clips into slots formed on the top, bottom, and sides of the housing of the workstation. Mounting clips and screws are provided to secure the workstation to the electrical panel. After tightening of the screws, the workstation is sealed in the electrical panel.

One of the problems associated with the prior art, including the prior art of FIGS. 1–14, is that in order to service and maintain the workstation, the entire unit must be removed from the electrical panel.

One prior art solution is to provide the connector halves which provide electrical connection between a relatively small rear portion of the back housing and the rest of the back housing. The display, however, is not accessible in this configuration.

Another prior art solution is to hingedly connect the front and rear housings. However, this configuration does not allow the rear housing to completely separate from the front housing because of the hinge and because one or more cables extend between the front and rear housings.

It is often necessary to service and maintain electrical and mechanical components of the workstation with the front and rear housings completely electrically and mechanically separated from one another to provide full access to the components such as the display, the display back lights, the disk drive, the CPU card, the keyboard card, and the power supply within the workstation.

SUMMARY OF THE INVENTION

An object of the present invention is to provide an industrial computer workstation which is relatively easy to maintain and service.

Another object of the present invention is to provide an industrial computer workstation wherein access to electronic and mechanical components of the workstation, including a display, is readily provided without significant disassembly of the workstation.

In carrying out the above objects and other objects of the present invention, an industrial computer workstation is provided which is relatively easy to maintain and service. The workstation includes a front housing having a front display window. The workstation also includes at least one input device supported at a front surface of the front housing. The workstation further includes a rear housing, electrical components including a computer housed within the rear housing and a display supported within one of the housings. The improvement of the invention includes a first connector half electrically coupled to the at least one input device and housed within the front housing and a second connector half coupled to the computer and housed within the rear housing. A mechanism is provided for allowing relative movement of the front and rear housings between a closed position in which the connector halves electrically mate and the display is aligned with the window for the projection of images through the window and an open position. In the open position, the housings and the connector halves are completely separated so that the electrical components including the display are readily accessible for maintenance and service.

Preferably, the mechanism for allowing relative movement includes at least one separable hinge connected to the housings to allow relative rotational movement of the front and rear housings and a removable connection between.

Also preferably, one of the first and second connector halves is mounted on a circuit board which is movable to a limited extent relative to its housing to facilitate mating with the other connector half during the relative movement from the open position to the closed position.

In general, the solution to the disassembly problem of the prior art is preferably provided by separably hinging the rear housing to the front housing which is adapted to be permanently mounted in a user's electrical panel. The front housing typically has a membrane keypad pointing device and/or touch screen for user interface with the computer housed in the rear housing. The front housing also has the window aligned with a flat panel display housed in the rear housing for the projection of images through the window in the closed position.

Electrical connection of the computer to the input devices supported by the front panel is provided by the first and second connector halves housed within their respective housings so that complete removal of the rear housing from the front housing becomes a quick job that requires no tools. By providing this level of access to the rear housing which houses the vast majority of the electronic components of the workstation, service and maintenance are speeded up.

The first and second connector halves which provides the cableless electrical connection electrically mate together as the hinged front and rear housings are piloted and latched into place. The latch and the at least one separable hinge eliminate the need for any tools for completely removing the rear housing from the front housing. Once the rear housing is unlatched and hinged out, it can be lifted off the at least one hinge without the use of tools.

Preferably, piloting is achieved using a tapered pin to steer and seat the rear housing against the front housing.

Consequently, both the front and rear housings are field replaceable units.

The above objects and other objects, features, and advantages of the present invention are readily apparent from the following detailed description of the best mode for carrying out the invention when taken in connection with the accompanying drawings.

BEST MODE FOR CARRYING OUT THE INVENTION

In general, this invention is for an industrial computer workstation which is relatively easy to maintain and service by allowing easy access to electronic components housed within the workstation and particularly within a rear housing of the workstation. Such electronic components typically include a display, a computer and display back lights. Previous designs either required significant disassembly of the workstation to achieve major component access or replacement.

Figure 5:
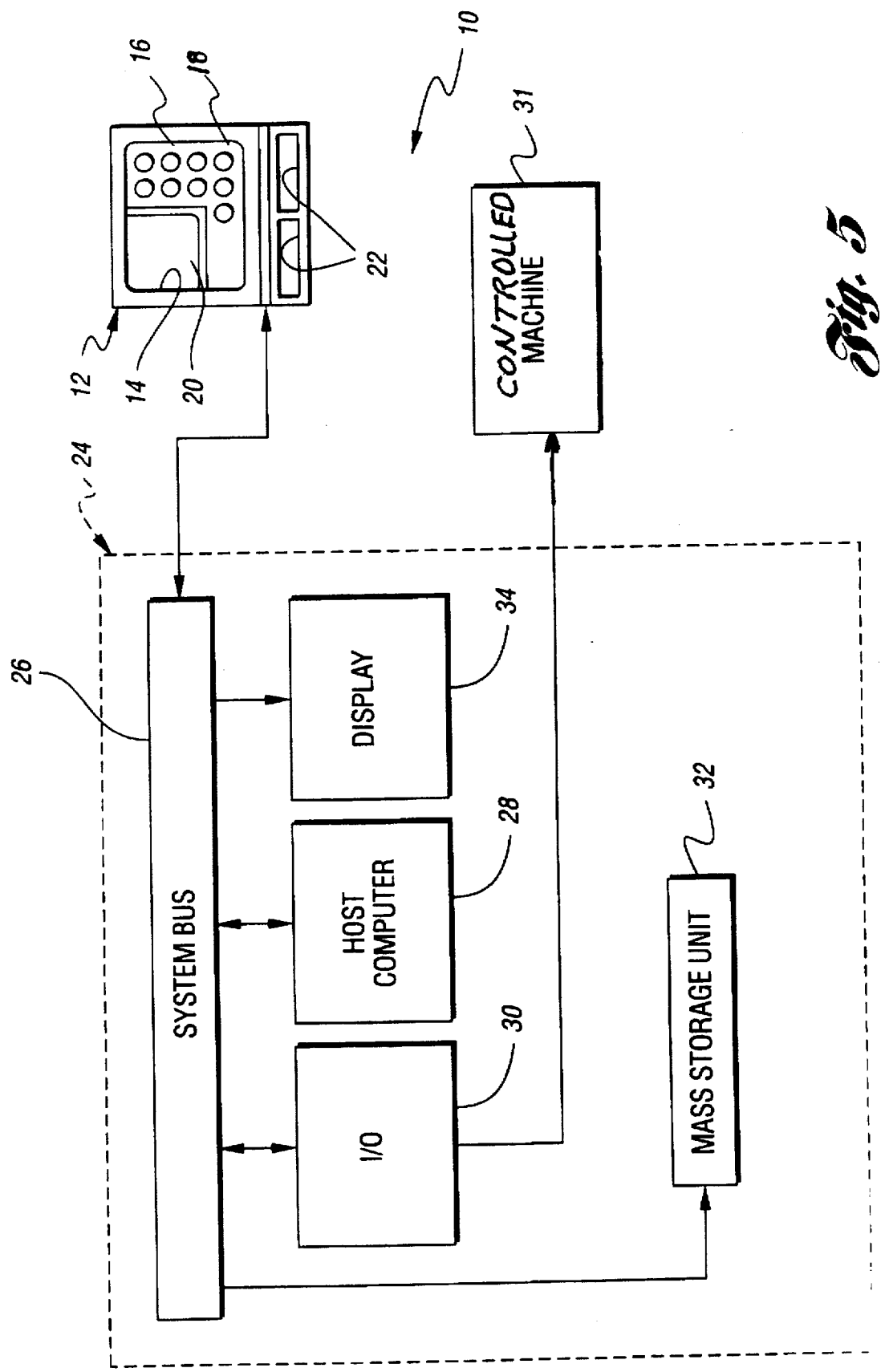
FIG. 5 is a schematic diagram of an industrial control computer workstation of the present invention which is relatively easy to maintain and service.
Figure 6:
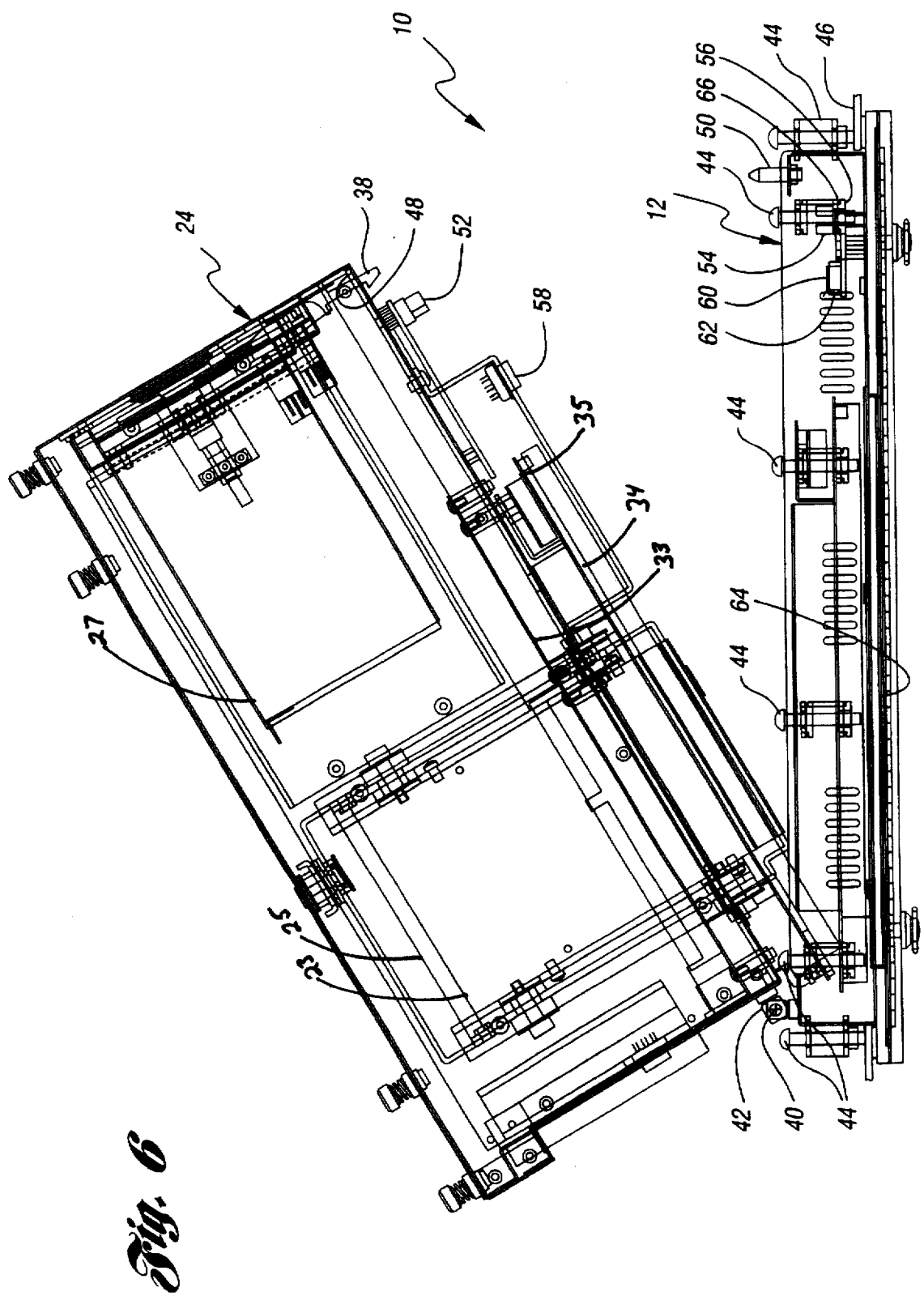
FIG. 6 is a top plan broken away view of the industrial control computer workstation of the present invention in its partially open position.

Referring now to the drawing Figures, there is illustrated schematically in FIGS. 5 and 6, an industrial computer workstation, generally indicated at 10, which is relatively easy to service and maintain. The workstation 10 includes a front housing, generally indicated at 12, having a front display window 14. The front housing 12 supports at least one and, preferably, multiple input devices at its front surface such as a membrane keypad 16, an industrial pointing device 18 and a touch screen 20 supported within the window 14. The front housing 12 also, preferably, includes slots 22 therethrough to access a drive such as a floppy drive 23, CDROM drive, optical, or tape drive housed within a rear housing, generally indicated at 24, of the workstation 10. A hard drive 25 is also provided within the rear housing 24.

The rear housing 24 also houses a system bus 26 and input/output circuits 30 to allow the workstation 10 to communicate with external devices such as a controlled machine 31 or process. The system bus 26 may be any standard system bus.

The rear housing 24 also preferably houses electronic components as a power supply 27, expansion cards 29, a CPU card 33, a display 34 and back lights 35 for the display 34. The rear housing 24 may also house one or more disk drives.

A computer 28 on the CPU card 33 of the workstation 10 may be any microprocessor having a sufficient amount of RAM and hard disk space for performing control algorithms which may be programmed from a mass storage unit 32.

The system bus 26 is connected to the display 34 which may be a flat panel display. The display 34 is aligned with the window 14 for the projection of images therethrough when the front and rear housings 12 and 24, respectively, are latched together in a closed position.

Referring now to FIG. 6, there is illustrated the workstation 10 in its partially open position after unlatching the rear housing 24 from the front housing 12 by manual manipulation of a latch 38. After unlatching by the latch 38, the rear housing 24 is rotatable about an axis 40 defined by separable hinges only one of which is illustrated at reference numeral 42. Alternatively, one continuous separable hinge may be provided.

Figure 1:
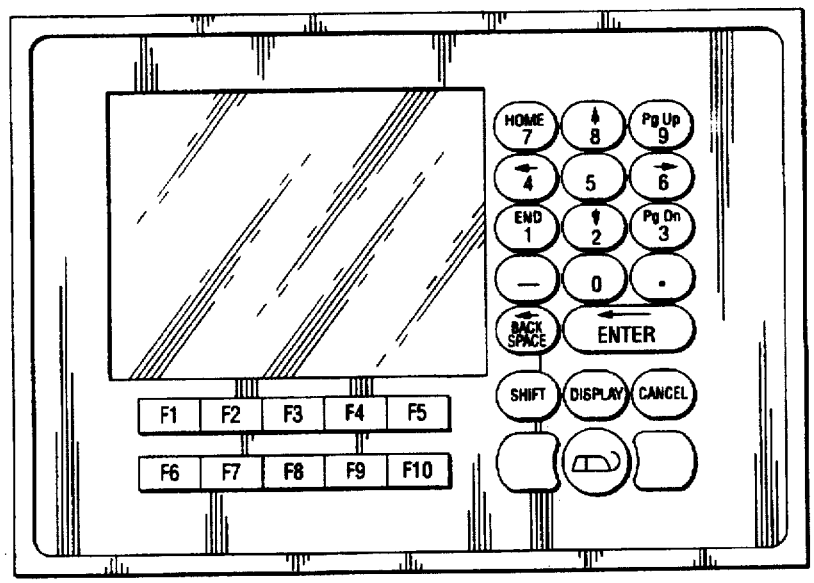
FIG. 1 is a front elevational view of a prior art industrial control computer workstation.
Figure 2:
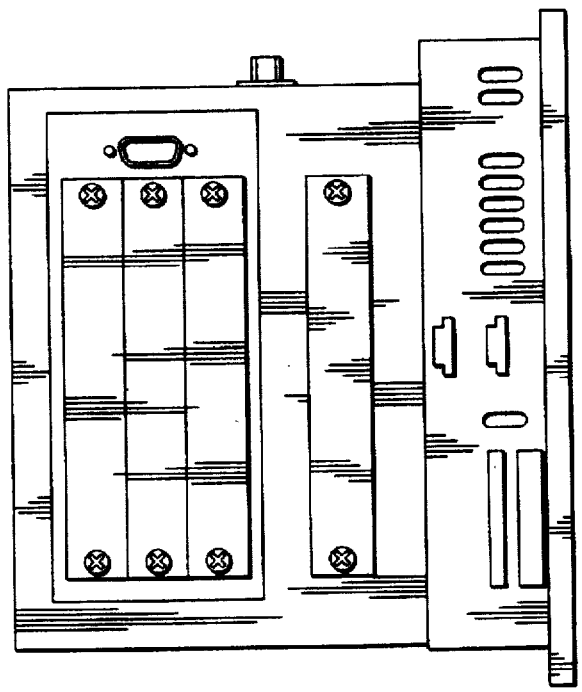
FIG. 2 is a side elevational view of the workstation of FIG. 1.
Figure 3:
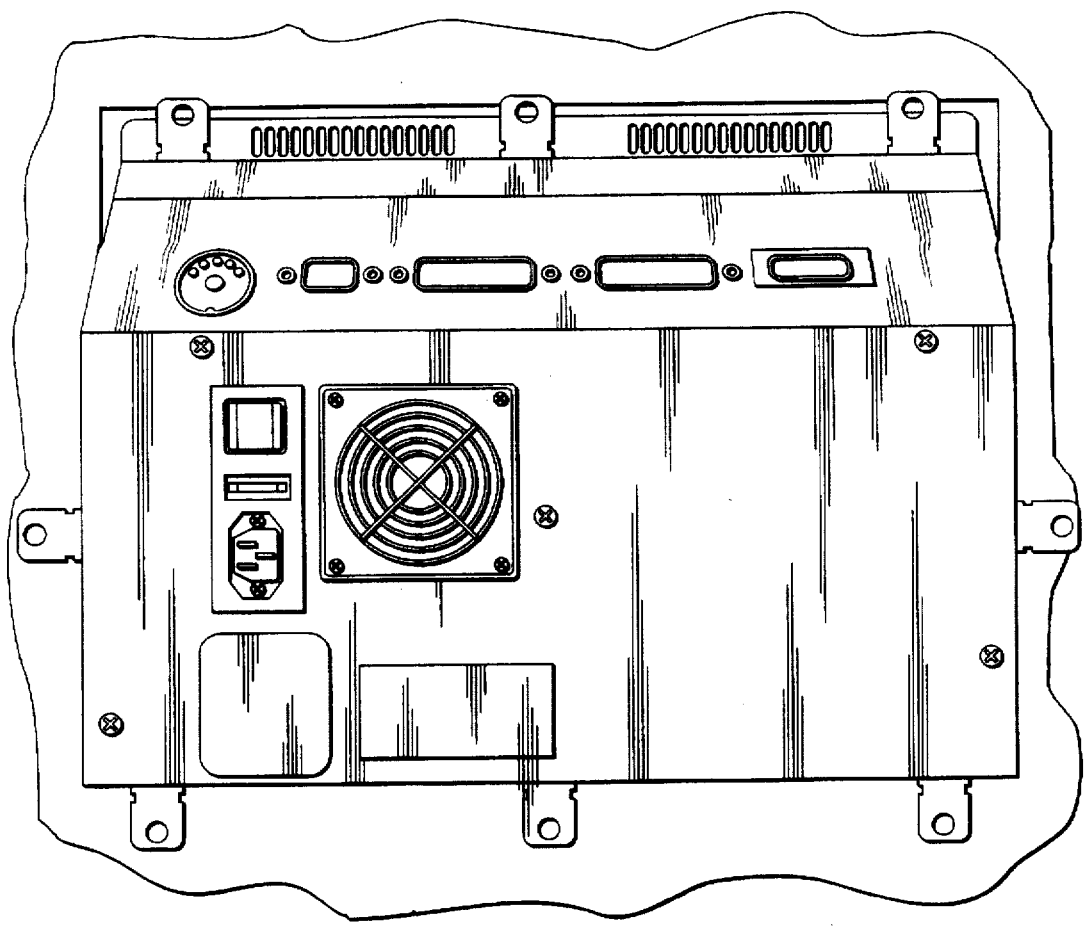
FIG. 3 is a rear perspective view of the workstation of FIGS. and 1 and 2 shown installed by way of mounting clips within an electrical panel.
Figure 4:
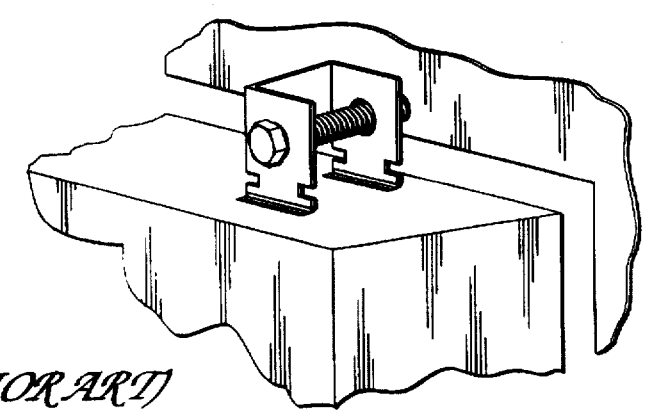
FIG. 4 is a perspective view partially broken away illustrating the use of a mounting clip to secure the workstation to an electrical panel.

Mounting clips 44 secure the front housing 12 to an electrical panel 46 in the same fashion as the mounting clips of FIGS. 3 and 4 secure the entire workstation thereof to the work panel shown therein.

With further reference to FIG. 6, the rear housing 24 can be further rotated relative to the front housing 12 and completely removed from the front housing 12 in a fully open position since the hinges 42 are separable. In this way, access to electronic components stored within the rear housing 24 such as the display 34, back lights 35 on the display 34, the CPU card 33, the drives 23 and 25, and the power supply 27 can be readily serviced and maintained. Also, other drives housed within the rear housing 24 can also be serviced and maintained.

Figure 7:
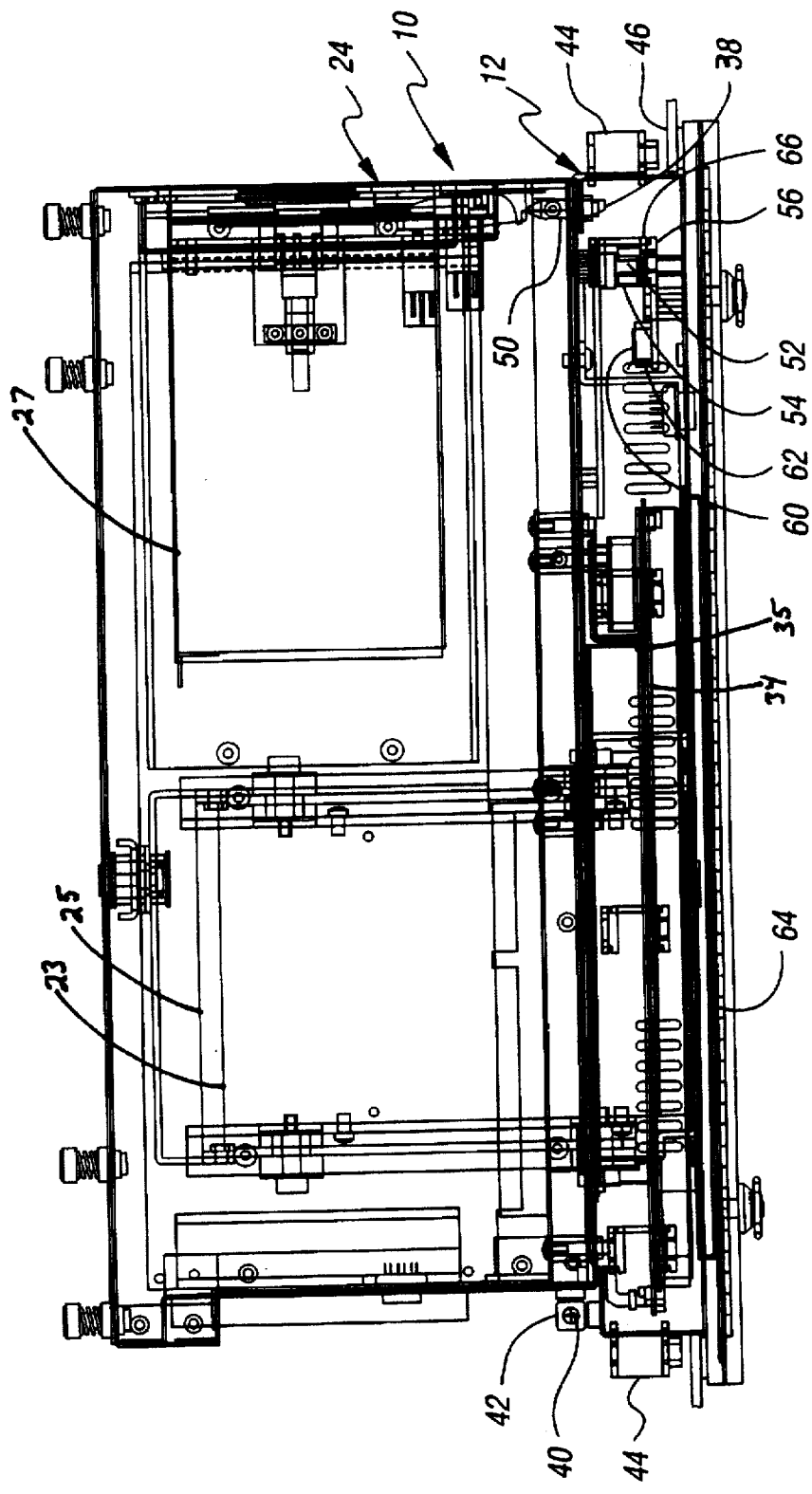
FIG. 7 is a view similar to the view of FIG. 6 wherein the workstation is in its sealed, closed position.

A hole 48 formed adjacent the latch 38 in the rear housing 24, together with a tapered locating pin 50, guide relative movement of the front and rear housings 12 and 24 about the axis 40 from the open position to a closed position, as illustrated in FIG. 7, to facilitate mating of connector halves 52 and 54 located in the rear housing 24 and the front housing 12, respectively.

The second connector half 54 is preferably mounted on a circuit board 56 which floats or, in other words, is movable to a limited extent relative to the housing 12 to facilitate mating with the connector half 52 during movement from the partially open position of FIG. 6 to the closed position of FIG. 7.

Also illustrated in FIG. 6 is a keyboard connector 58 which allows connection of the computer within the rear housing 24 to be connected to an external keyboard.

Still referring to FIG. 6, the front housing 12 also houses a connector 60 for the membrane keypad 16, a connector 62 for a touch screen 64 supported in the window 14 of the front housing 12, and a connector 66 for the pointing device 18.

In turn, the first connector half 54 is connected to the connectors 60, 62 and 66 to provide interconnection to the second connector half 52 in the closed position of the workstation 10.

Referring again to FIG. 7, there is illustrated mating of the connector halves 52 and 54 in a sealed, closed position of the front housing 12 relative to the rear housing 24. Also, the locating pin 50 is located in the hole 48 in the rear housing 24. Finally, the latch 38 is shown in its operative latching position.

Figure 8:
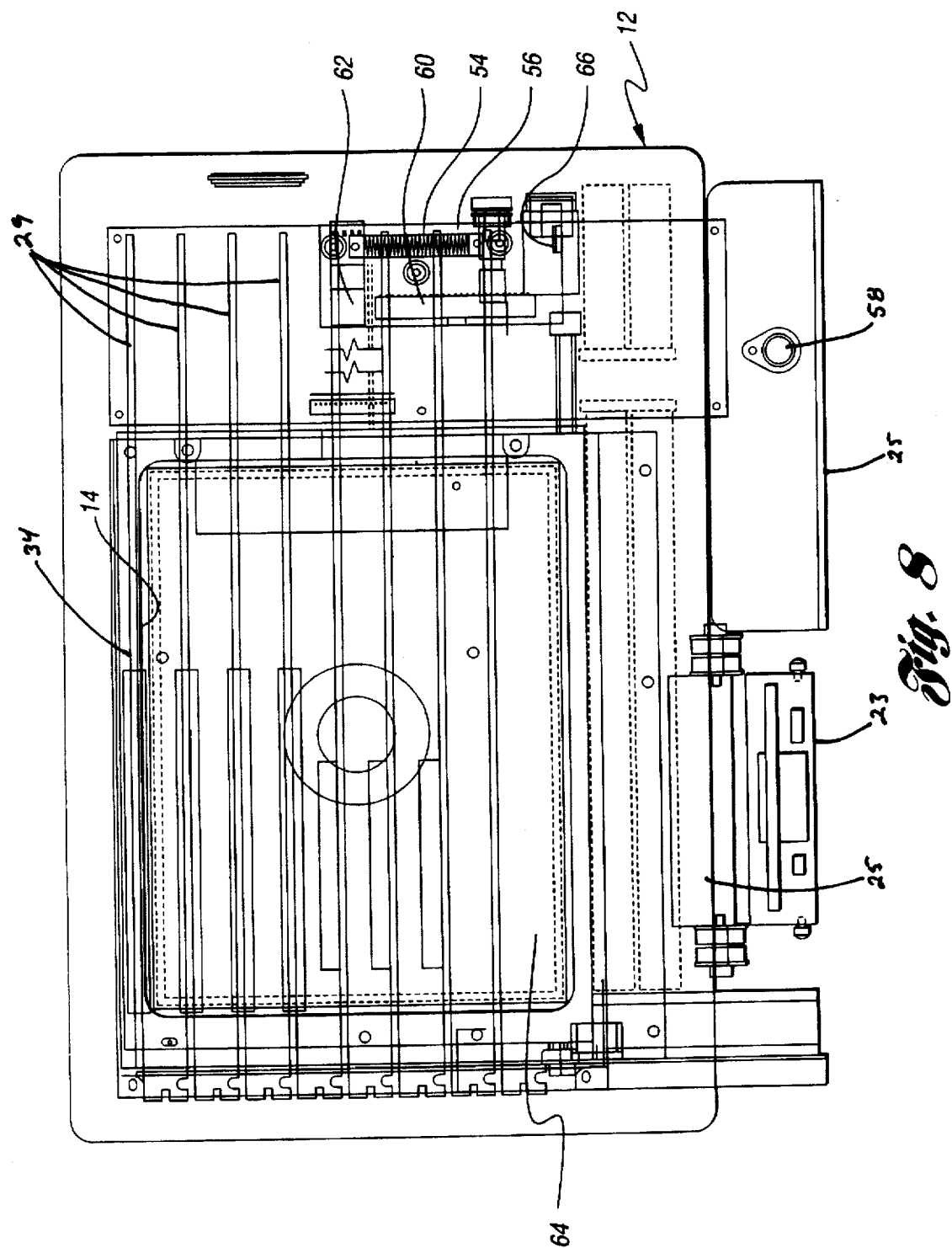
FIG. 8 is a front view of the front housing of the workstation with the electronic components supported thereby shown by solid lines.

Referring now to FIG. 8, there is illustrated electrical components housed within the front housing 12 such as the touch screen connector 62, the membrane keypad connector 60, and the pointing device connector 66, as well as the first half connector 54 all mounted on the floating circuit board 56. Also disclosed in FIG. 8 is the touch screen 64 within the window 14.

Figure 9:
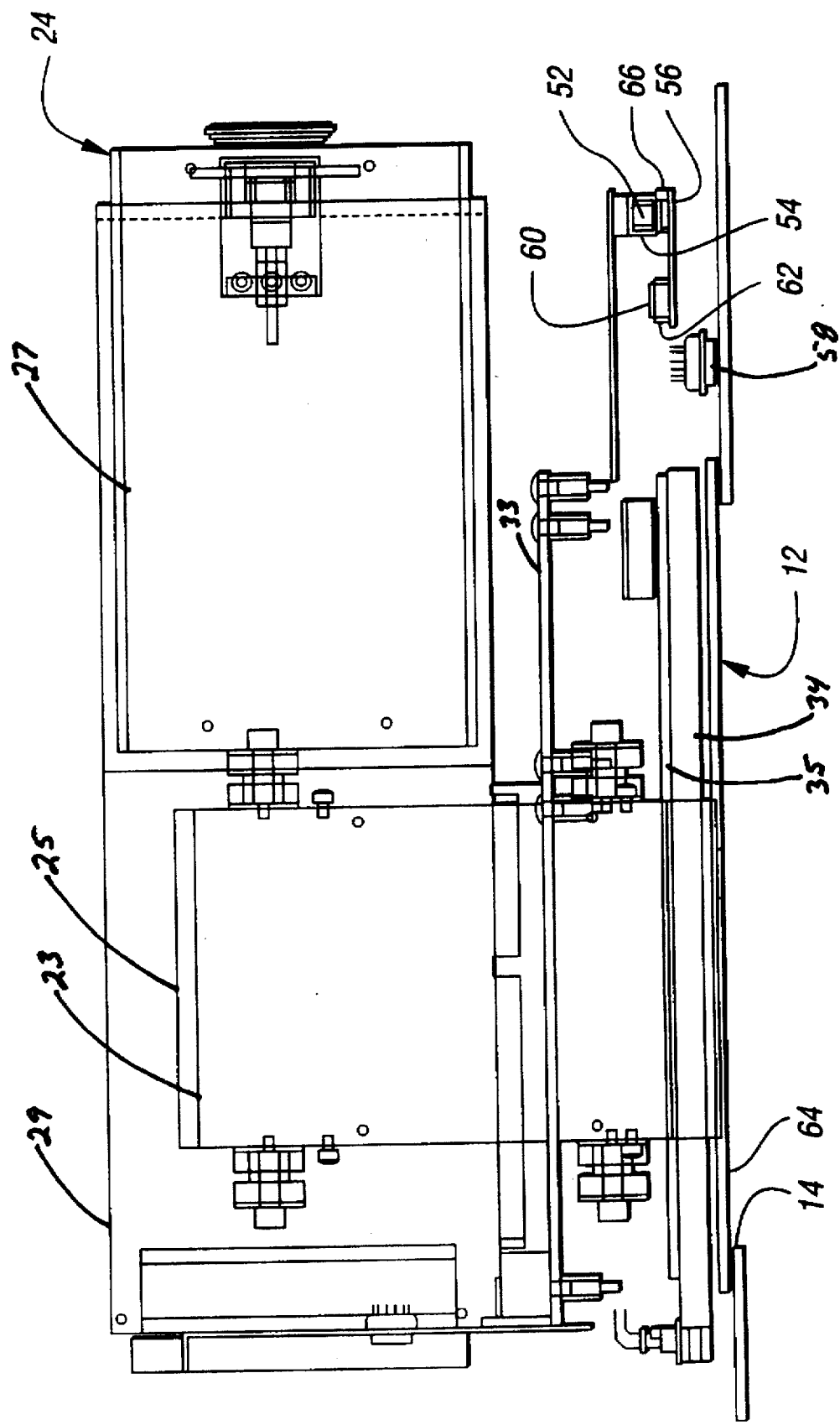
FIG. 9 is a top, broken away view of a portion of the workstation illustrating the first and second connector halves in their mating position.

Referring now to FIG. 9, there is illustrated a top view similar to the view of FIG. 7 wherein the electrical components are illustrated including the second half connector 52 shown in mating contact with the first half connector 54 in the closed position of the front and rear housings 12 and 24, respectively. Also, there is illustrated the touch screen connector 62 and the membrane keypad connector 60 which, together with the first half connector 54, are all mounted on the floating circuit board 56. Also, the pointing device connector 66 is shown as being mounted on the floating circuit board 56.

The advantages accruing to the improved industrial computer workstation 10 of the present invention are numerous. For example, the workstation 10 is relatively easy to maintain and service. Access to change electronic components housed within the front and rear housings 12 and 24, respectively, including the computer, the display 34 and the display back lights 35 is provided without significant housing disassembly, thereby achieving easy electronic component access and replacement.

The improvement of the present invention is preferably provided by hinging the rear housing 24 to the front housing 12 wherein the front housing 12 is permanently mounted in an end user's electrical panel 46. The front housing 12 preferably has a membrane keypad 16 to allow user interface with the computer 28 and a window 14 for the flat panel display 34. By making the electrical connection of the computer 28 to the input devices supported by the front housing 12 cableless, removal of the rear housing 24 from the front housing 12 becomes a quick job that requires no tools. Having this level of access to the rear housing 24 speeds service and maintenance.

The cableless electrical connection is preferably achieved by utilizing a two-part electrical connector such as connector halves 52 and 54 which electrically mate together as the separably hinged rear housing 24 is piloted and latched into place against the front housing 12. The latch 38 and the separable hinges 42 eliminate the need for any tools for removing the rear housing 24 from the front housing 12. Piloting is preferably achieved using a tapered pin such as the pin 54 to steer and seat the rear housing 24 against the front housing 12. Once the rear housing 24 is unlatched and hinged out, it can be lifted off the separable hinges 42 without the use of tools.

Consequently, both the front and rear housings 12 and 14, respectively, together with their associated housed mechanical and electrical components, are field replaceable units.

While the best mode for carrying out the invention has been described in detail, those familiar with the art to which this invention relates will recognize various alternative designs and embodiments for practicing the invention as defined by the following claims.

What is claimed is:

1. An industrial computer workstation which is relatively easy to maintain and service, the workstation including a front housing having a front display window, at least one input device supported at a front surface of the front housing, a rear housing, electrical components including a computer housed within the rear housing and a display supported within one of the housings, the improvement comprising:

a first connector half electrically connected to the at least one input device and housed within the front housing;

a second connector half coupled to the computer and housed within the rear housing; and means for allowing relative movement of the front and rear housings between a closed position in which the connector halves electrically mate and the display is aligned with the window for the projection of images through the window and an open position in which the housings and the connector halves are completely separated so that the electrical components including the display are readily accessible for maintenance and service.

2. The workstation as claimed in claim 1 wherein the means for allowing includes at least one separable hinge connected to the front and rear housings to allow relative rotational movement of the front and rear housings and a removable connection between the front and rear housings.

3. The workstation as claimed in claim 1 wherein one of the connector halves is mounted on a circuit board which is movable to a limited extent relative to its housing to facilitate mating with the other connector half during the relative movement from the open position to the closed position.

4. The workstation as claimed in claim 1 further comprising pilot means on the housings for guiding the relative movement of the housings from the open position to the closed position to facilitate mating of the connector halves.

5. The workstation as claimed in claim 4 wherein the pilot means includes a tapered pin mounted on one of the housings.

6. The workstation as claimed in claim 1 further comprising a latch mechanism for removably connecting the housings.

7. The workstation as claimed in claim 1 wherein the front housing is adapted to be fixedly mounted in an electrical panel.

8. The workstation as claimed in claim 1 wherein the at least one input device includes a touch screen mounted in the front display window.

9. The workstation as claimed in claim 1 wherein the at least one input device includes a set of keys.

10. The workstation as claimed in claim 9 wherein the set of keys defines a membrane keypad.

11. The workstation as claimed in claim 1 wherein the at least one input device includes a pointing device.

12. The workstation as claimed in claim 1 wherein the display is a flat panel display supported within the rear housing.

* * * * *